US012681052B2

(12) United States Patent
Liu et al.

(10) Patent No.: US 12,681,052 B2
(45) Date of Patent: Jul. 14, 2026

(54) SYSTEMS AND METHODS FOR OVERCURRENT DETECTION OF CHARGE PUMPS

(71) Applicant: ON-BRIGHT ELECTRONICS (SHANGHAI) CO., LTD., Shanghai (CN)

(72) Inventors: Jiangwei Liu, Shanghai (CN); Qiang Luo, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 254 days.

(21) Appl. No.: 18/138,627

(22) Filed: Apr. 24, 2023

(65) Prior Publication Data

US 2023/0273246 A1     Aug. 31, 2023

(30) Foreign Application Priority Data

Feb. 25, 2022     (CN) .......................... 202210181827.1

(51) Int. Cl.
G01R 19/165          (2006.01)
H02J 7/00          (2026.01)
(Continued)

(52) U.S. Cl.
CPC .......... G01R 19/16571 (2013.01); H02J 7/62 (2026.01); H02M 3/07 (2013.01); H02J 2207/20 (2020.01)

(58) Field of Classification Search
None
See application file for complete search history.

(56) References Cited

U.S. PATENT DOCUMENTS 6,501,248 B2 * 12/2002 Fujiwara ............... H02J 7/0031
                                                                320/136
9,739,811 B2 *  8/2017 Zhang .............. G01R 19/16571
(Continued)

FOREIGN PATENT DOCUMENTS

CN          207625277 U      7/2018
CN          110557009 A     12/2019
(Continued)

OTHER PUBLICATIONS

Translation of CN 113422410 A by Li et al Sep. 21, 2021 (Year: 2021).*

(Continued)

*Primary Examiner* — Jermele M Hollington
(74) *Attorney, Agent, or Firm* — Faegre Drinker Biddle & Reath LLP

(57)          ABSTRACT

Overcurrent detector and method for a charging path of a charge pump. For example, an overcurrent detector for a charging path of a charge pump, the charging path including a switch associated with a switch on-resistance value, the charge pump being configured to receive an input voltage and generate an output voltage to charge a battery, the overcurrent detector including: a reference unit biased to the output voltage and configured to generate a reference voltage representing a predetermined threshold current for the switch of the charging path; a detection unit coupled to the reference unit and configured to generate a sensing voltage representing a charging current that flows through the switch of the charging path; and an output unit configured to generate an over-current-protection signal based at least in part on the reference voltage and the sensing voltage.

15 Claims, 5 Drawing Sheets

(51) Int. Cl.
*H02J 7/62*        (2026.01)
*H02M 3/07*       (2006.01)

(56) References Cited

U.S. PATENT DOCUMENTS

| | | | |
|---|---|---|---|
| 12,147,258 B2* | 11/2024 | Tseng | G05F 1/573 |
| 2017/0179739 A1* | 6/2017 | Webb | H02J 3/32 |
| 2019/0123541 A1 | 4/2019 | Takuma et al. | |
| 2019/0386481 A1 | 12/2019 | Cho et al. | |

FOREIGN PATENT DOCUMENTS

| | | | |
|---|---|---|---|
| CN | 110752641 A | 2/2020 | |
| CN | 113206306 A | 8/2021 | |
| CN | 113422410 A | 9/2021 | |
| TW | 202046553 A | 12/2020 | |
| WO | 2012/017697 A1 | 2/2012 | |

OTHER PUBLICATIONS

Taiwan Intellectual Property Office, Office Action issued Oct. 11, 2023, in Application No. 111123516.
China Patent Office, Office Action issued Jan. 14, 2025, in Application No. 202210181827.1.

* cited by examiner

SYSTEMS AND METHODS FOR OVERCURRENT DETECTION OF CHARGE PUMPS

1. CROSS-REFERENCES TO RELATED APPLICATIONS

This application claims priority to Chinese Patent Application No. 202210181827.1, filed Feb. 25, 2022, incorporated by reference herein for all purposes.

2. BACKGROUND OF THE INVENTION

Certain embodiments of the present invention are directed to circuits. More particularly, some embodiments of the invention provide systems and methods for overcurrent detection. Merely by way of example, some embodiments of the invention have been applied to charge pumps. But it would be recognized that the invention has a much broader range of applicability.

As the performance of electronic devices improves, the charging efficiency of these electronic devices also needs to become higher. As a result, charge pumps often are increasingly used as DC-DC voltage converters in the fast charging process of electronic devices. The charge pumps usually can provide low energy loss and high conversion efficiency. For example, switched-capacitor charge pumps often perform voltage conversion through opening and/or closing of switches and charging and/or discharging of capacitors. The magnitudes of currents that flow through the switches usually are important to the safe operation of these switches.

FIG. 1 is a simplified diagram showing a conventional charge pump. The charge pump 100 includes switches 110, 120, 130, 140, 150, 160, 170 and 180, and capacitors 190 and 192. The charge pump 100 is biased between a voltage 111 and a voltage 141. For example, the voltage 111 (e.g., PMID) is provide by an external voltage source and used as an input voltage by the charge pump 100. As an example, the voltage 141 (e.g., GND) is provided by a ground voltage source. The capacitor 190 includes a capacitor terminal 114 biased at a voltage 121 and a capacitor terminal 116 biased at a voltage 131. The capacitor 192 includes a capacitor terminal 154 biased at a voltage 161 and a capacitor terminal 156 biased at a voltage 171.

The charge pump 100 is configured to charge a battery 194 based at least in part on a periodic clock signal. The battery 194 includes a terminal 196 biased at a voltage 195 (e.g., VOUT) and a terminal 198 biased at the voltage 141 (e.g., GND). Each period of the clock signal includes a first charging duration and a second charging duration. For example, during the first charging duration, the clock signal is at a logic high level. As an example, during the second charging duration, the clock signal is at a logic low level. During the first charging duration, the charge pump 100 charges the battery 194 through a charging path 112 and a charging path 162 simultaneously. During the second charging duration, the charge pump 100 charges the battery 194 through a charging path 122 and a charging path 152 simultaneously. In some examples, the charge pump 100 receives the voltage 111 (e.g., PMID) and generates the voltage 195 (e.g., VOUT) that is equal to half of the voltage 111 (e.g., PMID). For example, the voltage 111 (e.g., PMID) is an input voltage of the charge pump 100. As an example, the voltage 195 (e.g., VOUT) is an output voltage of the charge pump 100.

During the first charging duration, the switches 110, 130, 160 and 180 are all closed, and the switches 120, 140, 150 and 170 are all open. The charging path 112 goes through the switch 110, the capacitor 190, and the switch 130. During the first charging duration, the charge pump 100 uses the charging path 112 to charge the battery 194 and also charge the capacitor 190. Also, the charging path 162 goes through the switch 180, the capacitor 192, and the switch 160. During the first charging duration, the charge pump 100 also uses the charging path 162 to charge the battery 194 by discharging the capacitor 192.

During the second charging duration, the switches 110, 130, 160 and 180 are all open, and the switches 120, 140, 150 and 170 are all closed. The charging path 152 goes through the switch 150, the capacitor 192, and the switch 170. During the second charging duration, the charge pump 100 uses the charging path 152 to charge the battery 194 and also charge the capacitor 192. Also, the charging path 122 goes through the switch 140, the capacitor 190, and the switch 120. During the second charging duration, the charge pump 100 also uses the charging path 122 to charge the battery 194 by discharging the capacitor 190.

The capacitor 190 is an energy storage component that is charged by the charging path 112 during the first charging duration and is discharged by the charging path 122 during the second charging duration. The capacitor 192 is an energy storage component that is charged by the charging path 152 during the second charging duration and is discharged by the charging path 162 during the first charging duration. The charging path 112 charges the capacitor 190 during the first charging duration, and the charging path 152 charges the capacitor 192 during the second charging duration. The charging path 162 discharges the capacitor 192 during the first charging duration, and the charging path 122 discharges the capacitor 190 during the second charging duration.

In some examples, each switch of the switches 110, 120, 130, 140, 150, 160, 170 and 180 is a transistor (e.g., a power transistor). During the first charging duration, the transistors 110, 130, 160 and 180 are all turned on, and the transistors 120, 140, 150 and 170 are all turned off. During the second charging duration, the transistors 110, 130, 160 and 180 are all turned off, and the transistors 120, 140, 150 and 170 are all turned on. In certain examples, the transistor 120 receives a drive signal 119 that turns on and/or turned off the transistor 120, and the transistor 130 receives a drive signal 129 that turns on and/or turned off the transistor 130. For example, if the drive signal 119 is at a logic high level, the transistor 120 is turned on, and if the drive signal 119 is at a logic low level, the transistor 120 is turned off. As an example, if the drive signal 129 is at the logic high level, the transistor 130 is turned on, and if the drive signal 129 is at the logic low level, the transistor 130 is turned off.

As shown in FIG. 1, when one or more currents that flow through the switch 110, the switch 120, the switch 130, the switch 140, the switch 150, the switch 160, the switch 170 and/or the switch 180 of the charge pump 100 are relatively high, if one or more voltages in the charge pump 100 fluctuate, the switch 110, the switch 120, the switch 130, the switch 140, the switch 150, the switch 160, the switch 170 and/or the switch 180 may be damaged due to one or more excess currents. Such damage often can adversely affect the fast charging of the electronic devices by the charge pump 100 and even pose a safety hazard to the electronic devices. Therefore, overcurrent detection is usually needed for charge pumps during their operation.

Often the overcurrent detection of charge pumps uses closed-loop systems with operation amplifiers. This type of overcurrent detection usually needs a detection time in the microsecond range. Within such detection time, the switch 110, the switch 120, the switch 130, the switch 140, the switch 150, the switch 160, the switch 170 and/or the switch 180 of the charge pump 100 may have already been damaged by the one or more excess currents before the one or more excess currents are detected.

Hence it is highly desirable to improve the technique for overcurrent detection of charge pumps.

3. BRIEF SUMMARY OF THE INVENTION

Certain embodiments of the present invention are directed to circuits. More particularly, some embodiments of the invention provide systems and methods for overcurrent detection. Merely by way of example, some embodiments of the invention have been applied to charge pumps. But it would be recognized that the invention has a much broader range of applicability.

According to certain embodiments, an overcurrent detector for a charging path of a charge pump, the charging path including a switch associated with a switch on-resistance value, the charge pump being configured to receive an input voltage and generate an output voltage to charge a battery, the overcurrent detector including: a reference unit biased to the output voltage and configured to generate a reference voltage representing a predetermined threshold current for the switch of the charging path; a detection unit coupled to the reference unit and configured to generate a sensing voltage representing a charging current that flows through the switch of the charging path; and an output unit configured to generate an over-current-protection signal based at least in part on the reference voltage and the sensing voltage; wherein the output unit is further configured to, in response to the sensing voltage exceeding the reference voltage, generate the over-current-protection signal that indicates the charging current exceeds the predetermined threshold current.

According to some embodiments, an overcurrent detection method for a charging path of a charge pump, the charging path including a switch associated with a switch on-resistance value, the charge pump being configured to receive an input voltage and generate an output voltage to charge a battery, the overcurrent detection method including: generating a reference voltage representing a predetermined threshold current for the switch of the charging path based at least in part on the output voltage; generating a sensing voltage representing a charging current that flows through the switch of the charging path; processing information associated with the reference voltage and the sensing voltage; and generating an over-current-protection signal based at least in part on the reference voltage and the sensing voltage; wherein the generating an over-current-protection signal based at least in part on the reference voltage and the sensing voltage includes: in response to the sensing voltage exceeding the reference voltage, generating the over-current-protection signal that indicates the charging current exceeds the predetermined threshold current.

Depending upon embodiment, one or more benefits may be achieved. These benefits and various additional objects, features and advantages of the present invention can be fully appreciated with reference to the detailed description and accompanying drawings that follow.

4. BRIEF DESCRIPTION OF THE DRAWINGS

FIG. 1 is a simplified diagram showing a conventional charge pump.

4

5. DETAILED DESCRIPTION OF THE INVENTION

Certain embodiments of the present invention are directed to circuits. More particularly, some embodiments of the invention provide systems and methods for overcurrent detection. Merely by way of example, some embodiments of the invention have been applied to charge pumps. But it would be recognized that the invention has a much broader range of applicability.

Figure 1:
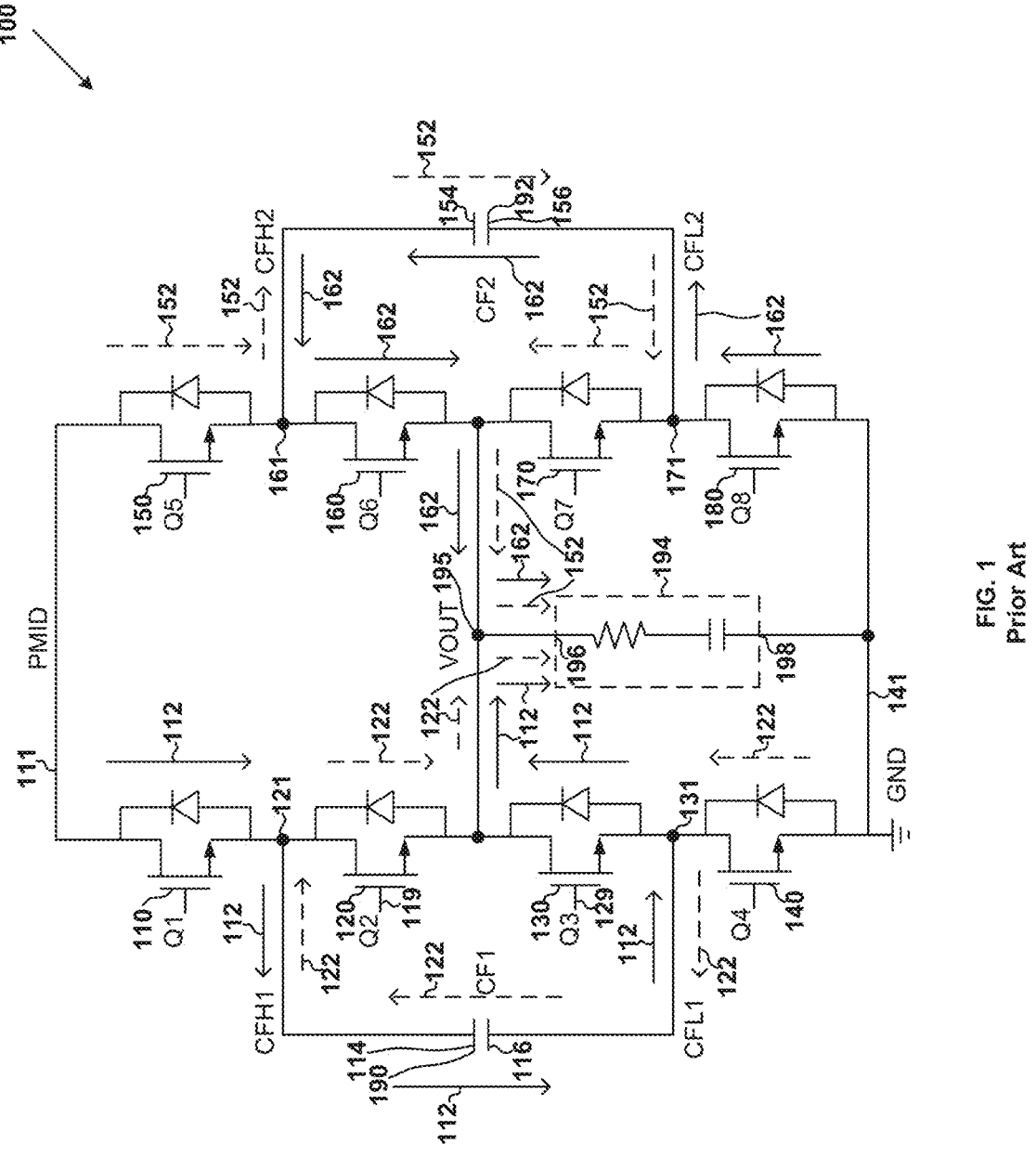

As shown in FIG. 1, the charge pump 100 converts the voltage 111 (e.g., PMID) to the voltage 195 (e.g., VOUT) that is equal to half of the voltage 111 (e.g., PMID) according to some embodiments. For example, if the voltage 111 (e.g., PMID) increases suddenly, the voltage 195 (e.g., VOUT) becomes less than half of the voltage 111 (e.g., PMID). As an example, if the voltage 111 (e.g., PMID) increases suddenly, one or more currents in the charge pump 100 increases, exceeding one or more predetermined overcurrent thresholds.

Figure 2:
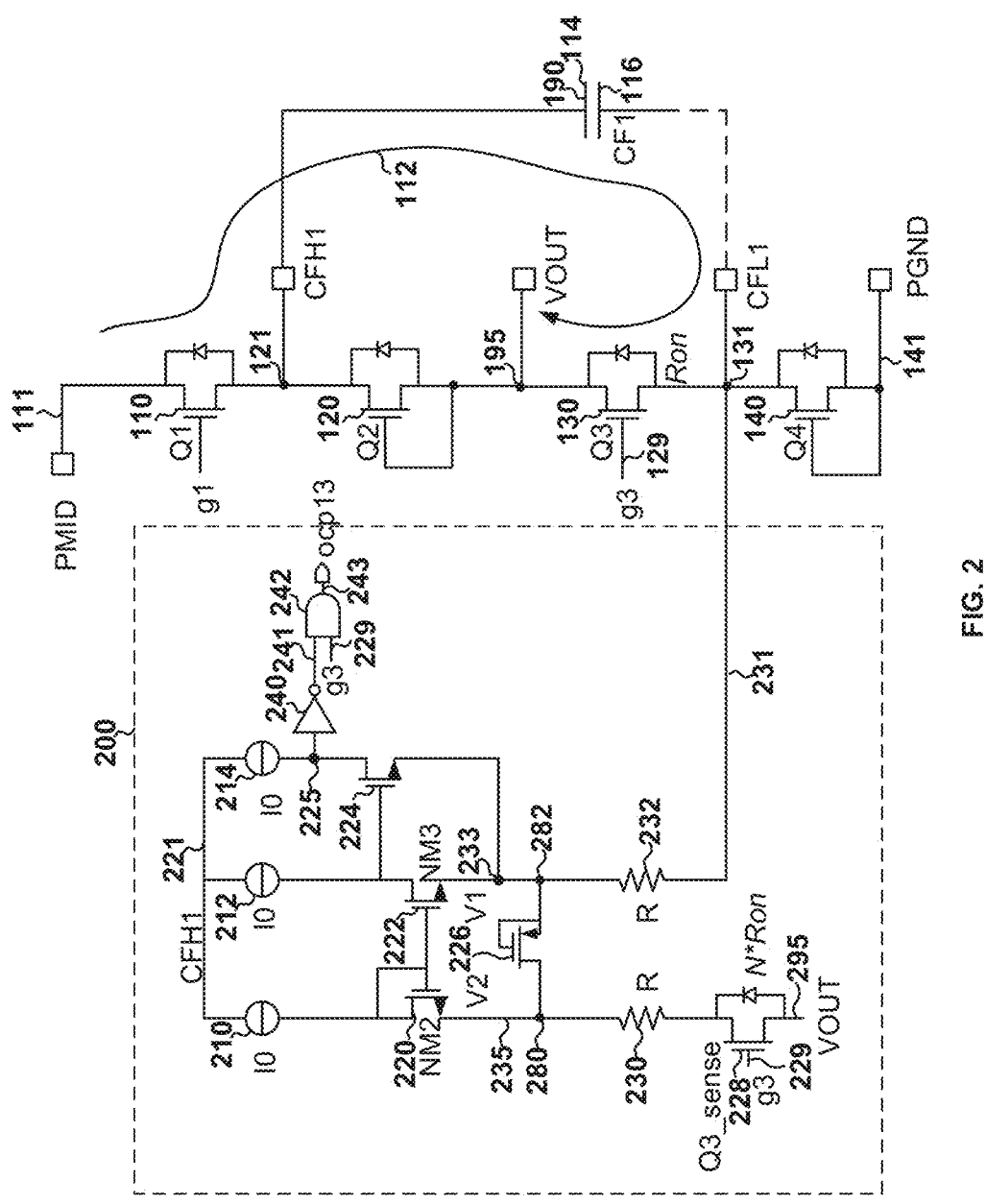
FIG. 2 is a simplified diagram showing an overcurrent detector for the charging path of the charge pump as shown in FIG. 1 according to certain embodiments of the present invention.

FIG. 2 is a simplified diagram showing an overcurrent detector for the charging path 112 of the charge pump 100 as shown in FIG. 1 according to certain embodiments of the present invention. This diagram is merely an example, which should not unduly limit the scope of the claims. One of ordinary skill in the art would recognize many variations, alternatives, and modifications. The overcurrent detector 200 includes current sources 210, 212 and 214, transistors 220, 222, 224, 226 and 228, resistors 230 and 232, a NOT gate 240, and an AND gate 242. For example, a voltage 221 is equal to the voltage 121, a voltage 295 is equal to the voltage 195, and a voltage 231 is equal to the voltage 131. As an example, the transistor 220 and the resistor 230 are connected to each other and biased to a voltage 235 (e.g., a reference voltage), and the transistor 222 and the resistor 232 are connected to each other and biased to a voltage 233 (e.g., a detection voltage).

For example, the overcurrent detector 200 performs overcurrent detection for the charging path 112 of the charge pump 100 periodically. As an example, the overcurrent detector 200 performs overcurrent detection for the charging path 112 of the charge pump 100 in response to occurrence of an event and/or receipt of a user input. Although the above has been shown using a selected group of components for the overcurrent detector 200, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

As shown in FIG. 2, the overcurrent detector 200 determines whether a current that flows through the switch 130 (e.g., the transistor 130) exceeds a predetermined threshold current (e.g., a predetermined overcurrent threshold) for the switch 130 (e.g., the transistor 130) in order to determine whether the charging path 112 of the charge pump 100 carries an excess current according to some embodiments. For example, if the current that flows through the transistor 130 exceeds the predetermined threshold current (e.g., a predetermined overcurrent threshold) for the transistor 130, the charging path 112 of the charge pump 100 carries an excess current. As an example, if the current that flows through the transistor 130 does not exceed the predetermined threshold current (e.g., a predetermined overcurrent threshold) for the transistor 130, the charging path 112 of the charge pump 100 does not carry an excess current.

For example, the predetermined threshold current (e.g., a predetermined overcurrent threshold) for the transistor 130 is set equal to the magnitude of the current that flows through the transistor 130 under normal operation. As an example, the predetermined threshold current (e.g., a predetermined overcurrent threshold) for the transistor 130 is set slightly larger (e.g., by a predetermined percentage) than the magnitude of the current that flows through the transistor 130 under normal operation. For example, the transistor 226 (e.g., the PMOS 226) is connected to the transistor 220 and the resistor 230 at a node 280 biased to the voltage 235. As an example, the transistor 226 is also connected to the transistor 222 and the resistor 232 at a node 282 biased to the voltage 233. For example, the voltage 235 (e.g., a reference voltage) represents the predetermined threshold current (e.g., a predetermined overcurrent threshold) for the transistor 130. As an example, the voltage 233 (e.g., a detection voltage) represents the current (e.g., a charging current) that flows through the transistor 130.

In certain examples, the transistor 226 (e.g., the PMOS 226) as a current holding unit allows a current to flow from the node 280 to the node 282, not from the node 282 to the node 280. For example, during a first charging duration of each period of a clock signal, the overcurrent detector 200 performs overcurrent detection for the charging path 112 of the charge pump 100. As an example, during a second charging duration of each period of the clock signal, the transistor 226 allows a current (e.g., a reference current) to flow from the current source 210 through the transistor 220 and the transistor 226 to the resistor 232.

In certain embodiments, the current sources 210, 212 and 214 generate three corresponding currents (e.g., three corresponding reference currents) that have the same magnitudes. In some examples, the current (e.g., a reference current) generated by the current source 210 is equal to the predetermined threshold current for the transistor 130 divided by N, and an on-resistance value of the transistor 228 is equal to an on-resistance value of the transistor 130 multiplied by N, wherein N is a predetermined constant (e.g., a predetermined integer) that is larger than 1. For example, N is equal to 20,000. As an example, the resistors 230 and 232 have the same resistance values. In some examples, the transistor 228 receives a drive signal 229 (e.g., a logic signal) that turns on and/or turned off the transistor 228. For example, the drive signal 229 is the same as the drive signal 129 that is received by the transistor 130. As an example, the transistor 228 becomes turned on at the same time as the transistor 130, and the transistor 228 becomes turned off at the same time as the transistor 130. In certain examples, the transistors 220 and 222 remain turned on, and the transistors 220 and 222 have the same on-resistance values. For example, the transistors 220 and 222 are coupled to each other. As an example, during the first charging duration, the charge pump 100 charges the battery 194 through the charging path 112. For example, during the first charging duration, the transistor 228 is turned on, and a current flows from the transistor 220 through the resistor 230 to the transistor 228. In some examples, during the first charging duration, the drive signal 129 and the drive signal 229 both are at the logic high level, and the transistor 130 and the transistor 228 both are turned on.

In some embodiments, during the first charging duration, if the voltage 233 does not exceed the voltage 235, the current that flows through the transistor 130 does not exceed the predetermined threshold current for the transistor 130. For example, when the voltage 233 does not exceed the voltage 235, the transistor 224 is turned off, and a voltage 225 is at a logic high level. In certain examples, the voltage 225 is received by the NOT gate 240, which in response generates a voltage 241 (e.g., a logic signal). As an example, if the voltage 225 is at the logic high level, the voltage 241 is at the logic low level. In some examples, the voltage 241 and the voltage 229 (e.g., a logic signal) are received by the AND gate 242, which in response generates an over-current-protection signal 243. For example, if the voltage 241 is at the logic low level and the voltage 229 is at the logic high level, the over-current-protection signal 243 is at the logic low level, indicating the charging path 112 of the charge pump 100 does not carry an excess current. As an example, if the over-current-protection signal 243 indicates that the charging path 112 of the charge pump 100 does not carry an excess current, the over-current-protection signal 243 is not used to turn off the transistor 110 and/or the transistor 130 and is not used to disconnect the charging path 112 of the charge pump 100.

In certain embodiments, during the first charging duration, if the voltage 233 exceeds the voltage 235, the current that flows through the transistor 130 exceeds the predetermined threshold current for the transistor 130. For example, when the voltage 233 exceeds the voltage 235, the transistor 224 is turned on, and the voltage 225 is at a logic low level. In certain examples, the voltage 225 is received by the NOT gate 240, which in response generates the voltage 241. As an example, if the voltage 225 is at the logic low level, the voltage 241 is at the logic high level. In some examples, the voltage 241 and the voltage 229 are received by the AND gate 242, which in response generates the over-current-protection signal 243. For example, if the voltage 241 is at the logic high level and the voltage 229 is also at the logic high level, the over-current-protection signal 243 is at the logic high level, indicating the charging path 112 of the charge pump 100 carries an excess current. As an example, if the over-current-protection signal 243 indicates that the charging path 112 of the charge pump 100 carries an excess current, the over-current-protection signal 243 is used to turn off the transistor 110 and/or the transistor 130 and to disconnect the charging path 112 of the charge pump 100.

According to some embodiments, during the second charging duration, the charge pump 100 does not use charging path 112 to charge the battery 194. For example, during the second charging duration, the transistor 130 is turned off and the drive signal 129 is at the logic low level. As an example, during the second charging duration, the transistor 228 is also turned off and the drive signal 229 is also at the logic low level. In certain examples, during the second charging duration, the current generated by the current source 210 flows to the capacitor terminal 116 of the capacitor 190, through the transistor 220, the transistor 226 and the resistor 232. In certain examples, during the second charging duration, the current generated by the current source 210 is maintained to flow through the transistor 220 in order to speed up the detection process during the first charging duration of the next period of the clock signal of the charge pump 100.

In certain embodiments, if the voltage 233 (e.g., a detection voltage) does not exceed the voltage 235 (e.g., a reference voltage), the over-current-protection signal 243 indicates that the current that flows through the transistor 130 does not exceed the predetermined threshold current for the transistor 130. For example, if the over-current-protection signal 243 indicates the current that flows through the transistor 130 does not exceed the predetermined threshold current for the transistor 130, the over-current-protection signal 243 is not used to turn off the transistor 110 and/or the transistor 130 (e.g., open the switch 110 and/or the switch 130) and is not used to disconnect the charging path 112 of the charge pump 100.

In some embodiments, if the voltage 233 (e.g., a detection voltage) exceeds the voltage 235 (e.g., a reference voltage), the over-current-protection signal 243 indicates that the current that flows through the transistor 130 exceeds the predetermined threshold current for the transistor 130. For example, if the over-current-protection signal 243 indicates the current that flows through the transistor 130 exceeds the predetermined threshold current for the transistor 130, the over-current-protection signal 243 is used to turn off the transistor 110 and/or the transistor 130 (e.g., open the switch 110 and/or the switch 130) and to disconnect the charging path 112 of the charge pump 100.

As mentioned above and further emphasized here, FIG. 2 is merely an example, which should not unduly limit the scope of the claims. One of ordinary skill in the art would recognize many variations, alternatives, and modifications. In some examples, the overcurrent detector 200 is used as an overcurrent detector for the charging path 152 of the charge pump 100 as shown in FIG. 1. For example, if the over-current-protection signal 243 is at the logic high level, the charging path 152 of the charge pump 100 carries an excess current, and the over-current-protection signal 243 is used to turn off the transistor 150 and/or the transistor 170 and to disconnect the charging path 152 of the charge pump 100. As an example, if the over-current-protection signal 243 is at the logic low level, the charging path 152 of the charge pump 100 does not carry an excess current, and the over-current-protection signal 243 is not used to turn off the transistor 150 and/or the transistor 170 and is not used to disconnect the charging path 152 of the charge pump 100. In certain examples, each period of a periodic clock signal includes a first charging duration and a second charging duration. For example, during the first charging duration of each period of the clock signal, the overcurrent detector 200 performs overcurrent detection for the charging path 112 of the charge pump 100. As an example, during the second charging duration of each period of the clock signal, the overcurrent detector 200 performs overcurrent detection for the charging path 152 of the charge pump 100.

Figure 3:
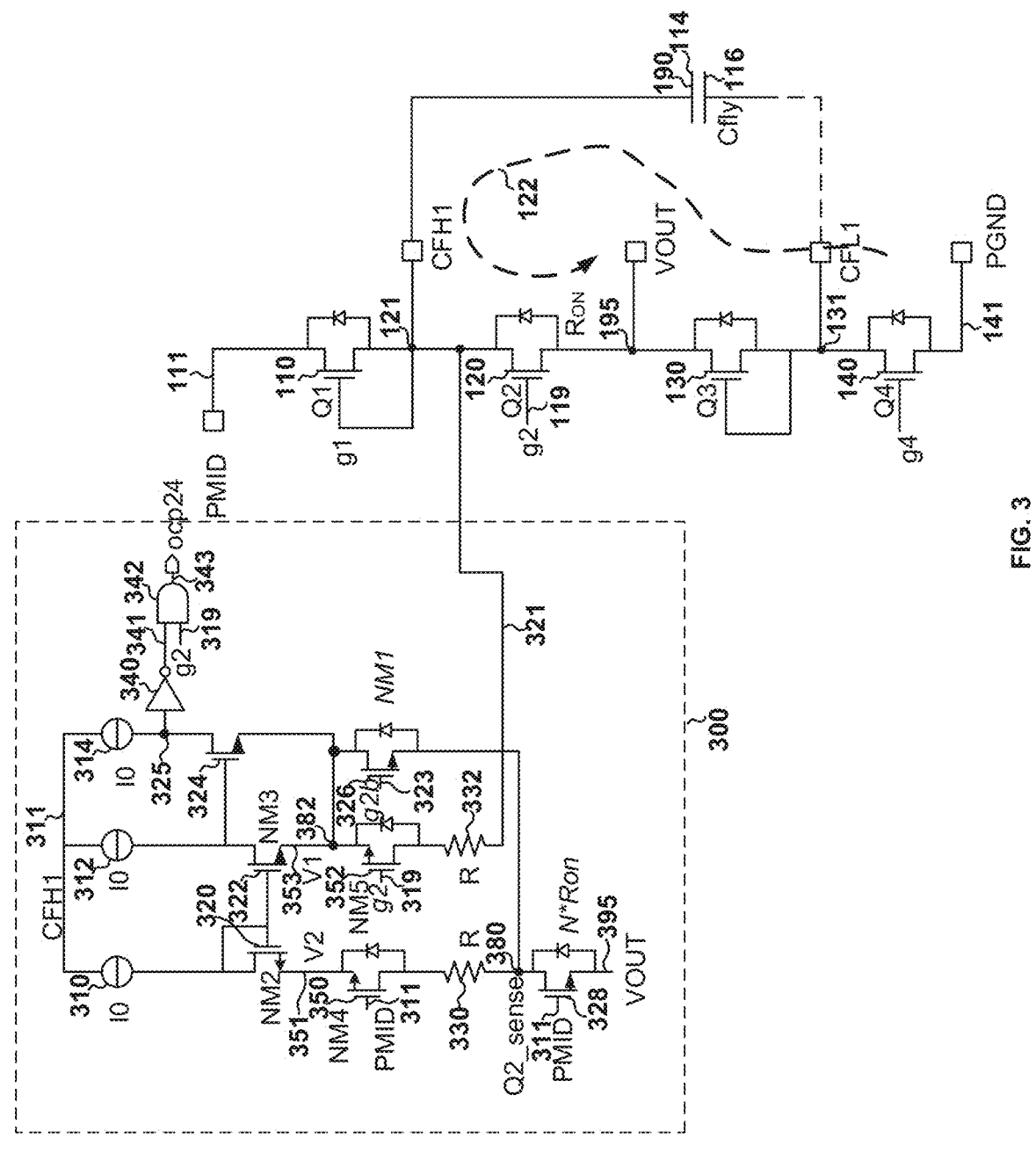
FIG. 3 is a simplified diagram showing an overcurrent detector for the charging path of the charge pump as shown in FIG. 1 according to some embodiments of the present invention.

FIG. 3 is a simplified diagram showing an overcurrent detector for the charging path 122 of the charge pump 100 as shown in FIG. 1 according to some embodiments of the present invention. This diagram is merely an example, which should not unduly limit the scope of the claims. One of ordinary skill in the art would recognize many variations, alternatives, and modifications. The overcurrent detector

300 includes current sources 310, 312 and 314, transistors 320, 322, 324, 326, 328, 350 and 352, resistors 330 and 332, a NOT gate 340, and an AND gate 342. For example, the voltage 311 is equal to the voltage 111, the voltage 395 is equal to the voltage 195, and the voltage 321 is equal to the voltage 121. As an example, the transistor 320 and the transistor 350 are connected to each other and biased to a voltage 351 (e.g., a reference voltage), and the transistor 322 and the transistor 352 are connected to each other and biased to a voltage 353 (e.g., a detection voltage). For example, the overcurrent detector 300 performs overcurrent detection for the charging path 122 of the charge pump 100 periodically. As an example, the overcurrent detector 300 performs overcurrent detection for the charging path 122 of the charge pump 100 in response to occurrence of an event and/or receipt of a user input. Although the above has been shown using a selected group of components for the overcurrent detector 300, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

As shown in FIG. 3, the overcurrent detector 300 determines whether a current that flows through the switch 120 (e.g., the transistor 120) exceeds a predetermined threshold current (e.g., a predetermined overcurrent threshold) for the switch 120 (e.g., the transistor 120) in order to determine whether the charging path 122 of the charge pump 100 carries an excess current according to some embodiments. For example, if the current that flows through the transistor 120 exceeds the predetermined threshold current (e.g., a predetermined overcurrent threshold) for the transistor 120, the charging path 122 of the charge pump 100 carries an excess current. As an example, if the current that flows through the transistor 120 does not exceed the predetermined threshold current (e.g., a predetermined overcurrent threshold) for the transistor 120, the charging path 122 of the charge pump 100 does not carry an excess current.

For example, the predetermined threshold current (e.g., a predetermined overcurrent threshold) for the transistor 120 is set equal to the magnitude of the current that flows through the transistor 120 under normal operation. As an example, the predetermined threshold current (e.g., a predetermined overcurrent threshold) for the transistor 120 is set slightly larger (e.g., by a predetermined percentage) than the magnitude of the current that flows through the transistor 120 under normal operation. For example, the transistor 326 (e.g., the NMOS 326) is connected to the resistor 330 and the transistor 328 at a node 380. As an example, the transistor 326 is also connected to the transistor 322 and the transistor 352 at a node 382 biased to the voltage 353. For example, the voltage 351 (e.g., a reference voltage) represents the predetermined threshold current (e.g., a predetermined overcurrent threshold) for the transistor 120. As an example, the voltage 353 (e.g., a detection voltage) represents the current (e.g., a charging current) that flows through the transistor 120.

In certain examples, the transistor 326 (e.g., the NMOS 326) as a current holding unit allows a current to flow from the node 382 to the node 380, not from the node 380 to the node 382. For example, during a first charging duration of each period of a clock signal, the transistor 326 allows a current (e.g., a reference current) to flow from the current source 312 through the transistor 322 and the transistor 326 to the transistor 328. As an example, during a second charging duration of each period of the clock signal, the overcurrent detector 300 performs overcurrent detection for the charging path 122 of the charge pump 100.

In certain embodiments, the current sources 310, 312 and 314 generate three corresponding currents (e.g., three corresponding reference currents) that have the same magnitudes. In some examples, the current (e.g., a reference current) generated by the current source 310 is equal to the predetermined threshold current for the transistor 120 divided by N, and an on-resistance value of the transistor 328 is equal to an on-resistance value of the transistor 120 multiplied by N, wherein N is a predetermined constant (e.g., a predetermined integer) that is larger than 1. For example, N is equal to 20,000. As an example, the resistors 330 and 332 have the same resistance values. In some examples, the transistor 352 receives a drive signal 319 (e.g., a logic signal) that turns on and/or turned off the transistor 352. For example, the drive signal 319 is the same as the drive signal 119 that is received by the transistor 120. As an example, the transistor 352 becomes turned on at the same time as the transistor 120, and the transistor 352 becomes turned off at the same time as the transistor 120. In certain examples, the transistors 320 and 322 remain turned on, and the transistors 320 and 322 have the same on-resistance values. For example, the transistors 320 and 322 are coupled to each other. As an example, during the second charging duration, the charge pump 100 charges the battery 194 through the charging path 122. For example, during the second charging duration, the transistor 352 is turned on, and a current flows from the transistor 322 through the transistor 352 to the resistor 332. In some examples, during the second charging duration, the drive signal 119 and the drive signal 319 both are at the logic high level, and the transistor 120 and the transistor 352 both are turned on. For example, the transistors 350 and 352 have the same on-resistance values. As an example, the current generated by the current source 310 flows to the transistor 328 through the transistor 320, the transistor 350, and the resistor 330.

For example, the transistor 326 receives a drive signal 323, which turns on and/or turns off the transistor 326. As an example, if the drive signal 319 is at the logic high level, the drive signal 323 is at the logic low level, and if the drive signal 319 is at the logic low level, the drive signal 323 is at the logic high level. In some examples, the transistors 350 and 328 each receive the voltage 311 and are each turned on by the voltage 311.

In some embodiments, during the second charging duration, if the voltage 353 does not exceed the voltage 351, the current that flows through the transistor 120 does not exceed the predetermined threshold current for the transistor 120. For example, when the voltage 353 does not exceed the voltage 351, the transistor 324 is turned off, and a voltage 325 is at a logic high level. In certain examples, the voltage 325 is received by the NOT gate 340, which in response generates a voltage 341 (e.g., a logic signal). As an example, if the voltage 325 is at the logic high level, the voltage 341 is at the logic low level. In some examples, the voltage 341 and the voltage 319 (e.g., a logic signal) are received by AND gate 342, which in response generates an over-current-protection signal 343. For example, if the voltage 341 is at the logic low level and the voltage 319 is at the logic high level, the over-current-protection signal 343 is at the logic low level, indicating the charging path 122 of the charge pump 100 does not carry an excess current. As an example, if the over-current-protection signal 343 indicates that the charging path 122 of the charge pump 100 does not carry an excess current, the over-current-protection signal 343 is not used to turn off the transistor 120 and/or the transistor 140 and is not used to disconnect the charging path 122 of the charge pump 100.

In certain embodiments, during the second charging duration, if the voltage 353 exceeds the voltage 351, the current that flows through the transistor 120 exceeds the predetermined threshold current for the transistor 120. For example, when the voltage 353 exceeds the voltage 351, the transistor 324 is turned on, and the voltage 325 is at a logic low level. In certain examples, the voltage 325 is received by the NOT gate 340, which in response generates the voltage 341. As an example, if the voltage 325 is at the logic low level, the voltage 341 is at the logic high level. In some examples, the voltage 341 and the voltage 319 are received by the AND gate 342, which in response generates the over-current-protection signal 343. For example, if the voltage 341 is at the logic high level and the voltage 319 is also at the logic high level, the over-current-protection signal 343 is at the logic high level, indicating the charging path 122 of the charge pump 100 carries an excess current. As an example, if the over-current-protection signal 343 indicates that the charging path 122 of the charge pump 100 carries an excess current, the over-current-protection signal 343 is used to turn off the transistor 120 and/or the transistor 140 and to disconnect the charging path 122 of the charge pump 100.

According to some embodiments, during the first charging duration, the charge pump 100 does not use charging path 122 to charge the battery 194. For example, during the first charging duration, the transistor 120 is turned off and the drive signal 119 is at the logic low level. As an example, during the first charging duration, the transistor 352 is also turned off and the drive signal 319 is also at the logic low level. In certain examples, during the first charging duration, the current generated by the current source 312 flows to the transistor 328, through the transistor 322 and the transistor 326. In some examples, during the first charging duration, the current generated by the current source 312 is maintained to flow through the transistor 322 in order to speed up the detection process during the second charging duration of the next period of the clock signal of the charge pump 100. For example, the transistor 352 includes a parasitic diode that limits the voltage drop from the drain terminal of the transistor 326 to the source terminal of the transistor 326 when the transistor 326 is turned on. As an example, the transistor 352 includes a parasitic diode that protects the transistor 326 when the transistor 326 is turned on.

In certain embodiments, if the voltage 353 (e.g., a detection voltage) does not exceed the voltage 351 (e.g., a reference voltage), the over-current-protection signal 343 indicates that the current that flows through the transistor 120 does not exceed the predetermined threshold current for the transistor 120. For example, if the over-current-protection signal 343 indicates the current that flows through the transistor 120 does not exceed the predetermined threshold current for the transistor 120, the over-current-protection signal 343 is not used to turn off the transistor 120 and/or the transistor 140 (e.g., open the switch 120 and/or the switch 140) and is not used to disconnect the charging path 122 of the charge pump 100.

In certain embodiments, if the voltage 353 (e.g., a detection voltage) exceeds the voltage 351 (e.g., a reference voltage), the over-current-protection signal 343 indicates that the current that flows through the transistor 120 exceeds the predetermined threshold current for the transistor 120. For example, if the over-current-protection signal 343 indicates the current that flows through the transistor 120 exceeds the predetermined threshold current for the transistor 120, the over-current-protection signal 343 is used to turn off the transistor 120 and/or the transistor 140 (e.g., open the switch 120 and/or the switch 140) and to disconnect the charging path 122 of the charge pump 100.

As mentioned above and further emphasized here, FIG. 3 is merely an example, which should not unduly limit the scope of the claims. One of ordinary skill in the art would recognize many variations, alternatives, and modifications. In some examples, the overcurrent detector 300 is used as an overcurrent detector for the charging path 162 of the charge pump 100 as shown in FIG. 1. For example, if the over-current-protection signal 343 is at the logic high level, the charging path 162 of the charge pump 100 carries an excess current, and the over-current-protection signal 343 is used to turn off the transistor 120 and/or the transistor 140 and to disconnect the charging path 162 of the charge pump 100. As an example, if the over-current-protection signal 343 is at the logic low level, the charging path 162 of the charge pump 100 does not carry an excess current, and the over-current-protection signal 343 is not used to turn off the transistor 120 and/or the transistor 140 and is not used to disconnect the charging path 162 of the charge pump 100. In certain examples, each period of a periodic clock signal includes a first charging duration and a second charging duration. For example, during the first charging duration of each period of the clock signal, the overcurrent detector 300 performs overcurrent detection for the charging path 162 of the charge pump 100. As an example, during the second charging duration of each period of the clock signal, the overcurrent detector 300 performs overcurrent detection for the charging path 122 of the charge pump 100.

Figure 4:
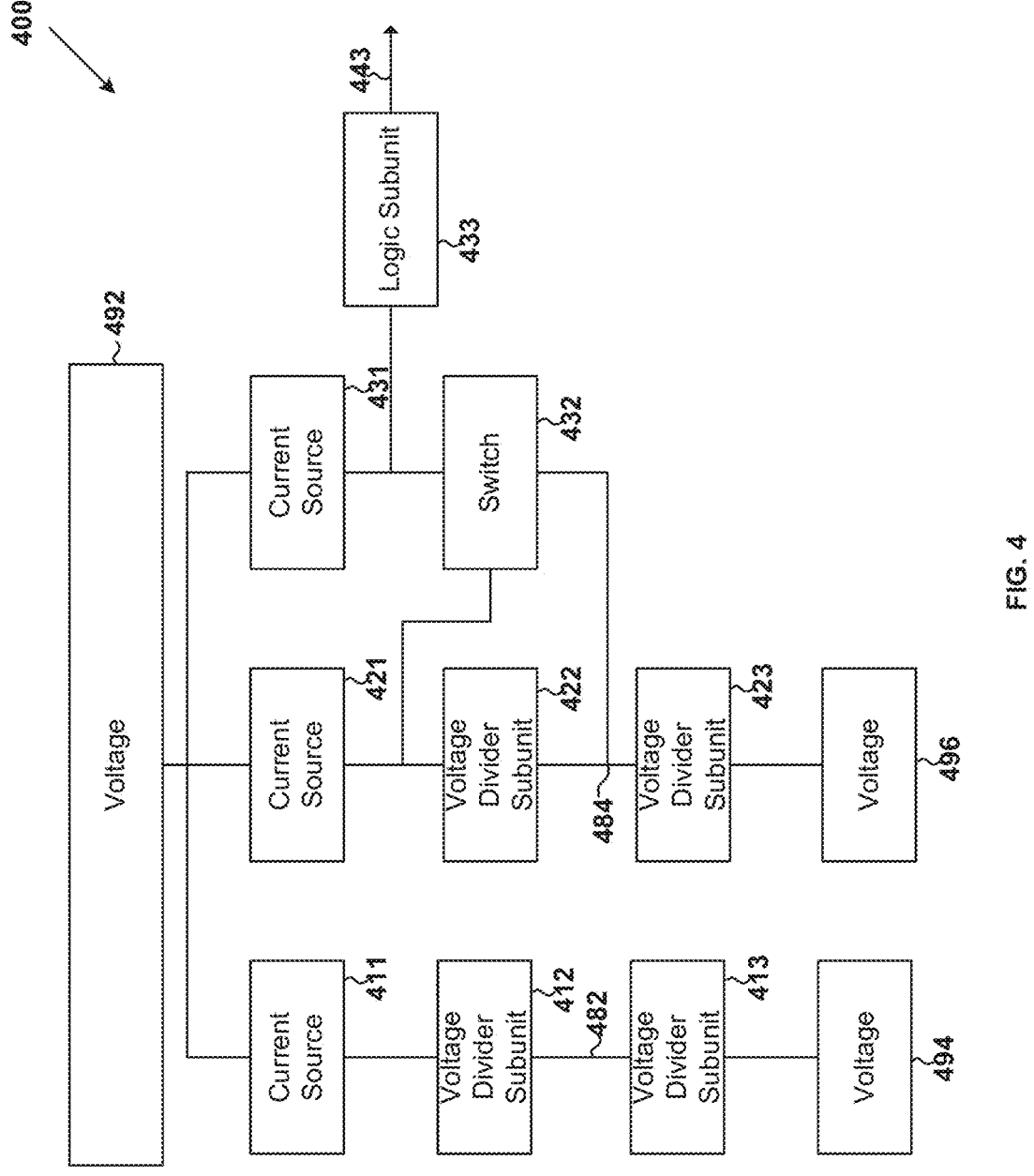
FIG. 4 is a simplified diagram showing an overcurrent detector for the charging path and/or another charging path of the charge pump as shown in FIG. 1 according to certain embodiments of the present invention.

FIG. 4 is a simplified diagram showing an overcurrent detector for the charging path 112 and/or the charging path 122 of the charge pump 100 as shown in FIG. 1 according to certain embodiments of the present invention. This diagram is merely an example, which should not unduly limit the scope of the claims. One of ordinary skill in the art would recognize many variations, alternatives, and modifications. The overcurrent detector 400 includes current sources 411, 421 and 431, voltage divider subunits 412, 413, 422 and 423, a switch 432, and a logic subunit 433. For example, the overcurrent detector 400 receives voltages 492, 494 and 496. As an example, the voltage divider subunits 412 and 413 are connected to each other and biased to a voltage 482, and the voltage divider subunits 422 and 423 are connected to each other and biased to a voltage 484. Although the above has been shown using a selected group of components for the overcurrent detector 400, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

According to some embodiments, the overcurrent detector 400 is the overcurrent detector 200 for the charging path 112 of the charge pump 100. For example, the voltage 492 is the voltage 221, which is equal to the voltage 121. As an example, the voltage 494 is the voltage 295, which is equal to the voltage 195. For example, the voltage 496 is the voltage 231, which is equal to the voltage 131. In certain examples, the current sources 411, 421 and 431 are the current sources 210, 212 and 214 respectively. In some examples, the voltage divider subunit 412 includes the transistor 220, the voltage divider subunit 413 includes the resistor 230 and the transistor 228, the voltage divider subunit 422 includes the transistor 222, and the voltage divider subunit 423 includes the resistor 232. For example, the switch 432 is the transistor 224. As an example, the logic subunit 433 includes the NOT gate 240 and the AND gate 242. In certain examples, the voltage 482 (e.g., a reference voltage) is the voltage 235, and the voltage 484 (e.g., a detection voltage) is the voltage 233.

According to certain embodiments, the overcurrent detector 400 is the overcurrent detector 300 for the charging path 122 of the charge pump 100. For example, the voltage 492 is the voltage 311, which is equal to the voltage 111. As an example, the voltage 494 is the voltage 395, which is equal to the voltage 195. For example, the voltage 496 is the voltage 321, which is equal to the voltage 121. In certain examples, the current sources 411, 421 and 431 are the current sources 310, 312 and 314 respectively. In some examples, the voltage divider subunit 412 includes the transistor 320, the voltage divider subunit 413 includes the transistor 350, the resistor 330 and the transistor 328, the voltage divider subunit 422 includes the transistor 322, and the voltage divider subunit 423 includes the transistor 352 and the resistor 332. For example, the switch 432 is the transistor 324. As an example, the logic subunit 433 includes the NOT gate 340 and the AND gate 342. In certain examples, the voltage 482 (e.g., a reference voltage) is the voltage 351, and the voltage 484 (e.g., a detection voltage) is the voltage 353.

In some embodiments, the current source 411 and the voltage divider subunits 412 and 413 are connected in series, biased between the voltage 492 and the voltage 494. For example, the voltage 492 is higher than the voltage 494. As an example, the current source 411 (e.g., the current source 210 and/or the current source 310) generates a current that is directly proportional to a predetermined threshold current (e.g., a predetermined threshold current for the transistor 130 and/or a predetermined threshold current for the transistor 120). In certain examples, the voltage divider subunits 412 and 413 are used to generate the voltage 482 (e.g., the voltage 235 and/or the voltage 351).

In certain embodiments, the current source 421 and the voltage divider subunits 422 and 423 are connected in series, biased between the voltage 492 and the voltage 496. For example, the voltage 496 is lower than the voltage 492 but higher than the voltage 494. As an example, a current generated by the current source 421 (e.g., the current source 212 and/or the current source 312) is equal to the current generated by the current source 411 (e.g., the current source 210 and/or the current source 310). In certain examples, the voltage divider subunits 422 and 423 are used to generate the voltage 484 (e.g., the voltage 233 and/or the voltage 353).

According to some embodiments, the current source 431 and the switch 432 are connected, biased between the voltage 492 and the voltage 484. For example, a current generated by the current source 431 (e.g., the current source 214 and/or the current source 314) is equal to the current generated by the current source 411 (e.g., the current source 210 and/or the current source 310). As an example, the logic subunit 433 is connected to the current source 431 and the switch 432.

According to certain embodiments, the logic subunit 433 generates an over-current-protection signal 443 (e.g., the over-current-protection signal 243 and/or the over-current-protection signal 343) based at least in part on the switch 432 (e.g., the transistor 224 and/or the transistor 324). In some examples, when the switch 432 is open, the logic subunit 433 generates the over-current-protection signal 443 that indicates the charging path (e.g., the charging path 112 and/or the charging path 122) does not carry an excess current. For example, if the over-current-protection signal 433 indicates that the charging path (e.g., the charging path 112 and/or the charging path 122) does not carry an excess current, the over-current-protection signal 433 is not used to make the charging path an open circuit. In certain examples, when the switch 432 is closed, the logic subunit 433 generates the over-current-protection signal 443 that indicates the charging path (e.g., the charging path 112 and/or the charging path 122) carries an excess current. For example, if the over-current-protection signal 433 indicates that the charging path (e.g., the charging path 112 and/or the charging path 122) carries an excess current, the over-current-protection signal 433 is used to make the charging path an open circuit.

As mentioned above and further emphasized here, FIG. 4 is a simplified diagram is merely an example, which should not unduly limit the scope of the claims. One of ordinary skill in the art would recognize many variations, alternatives, and modifications. In some examples, the overcurrent detector 400 is used as an overcurrent detector for the charging path 152 and/or the charging path 162 of the charge pump 100 as shown in FIG. 1. For example, the overcurrent detector 400 is the overcurrent detector 200 for the charging path 152 of the charge pump 100. As an example, the overcurrent detector 400 is the overcurrent detector 300 for the charging path 162 of the charge pump 100.

Figure 5:
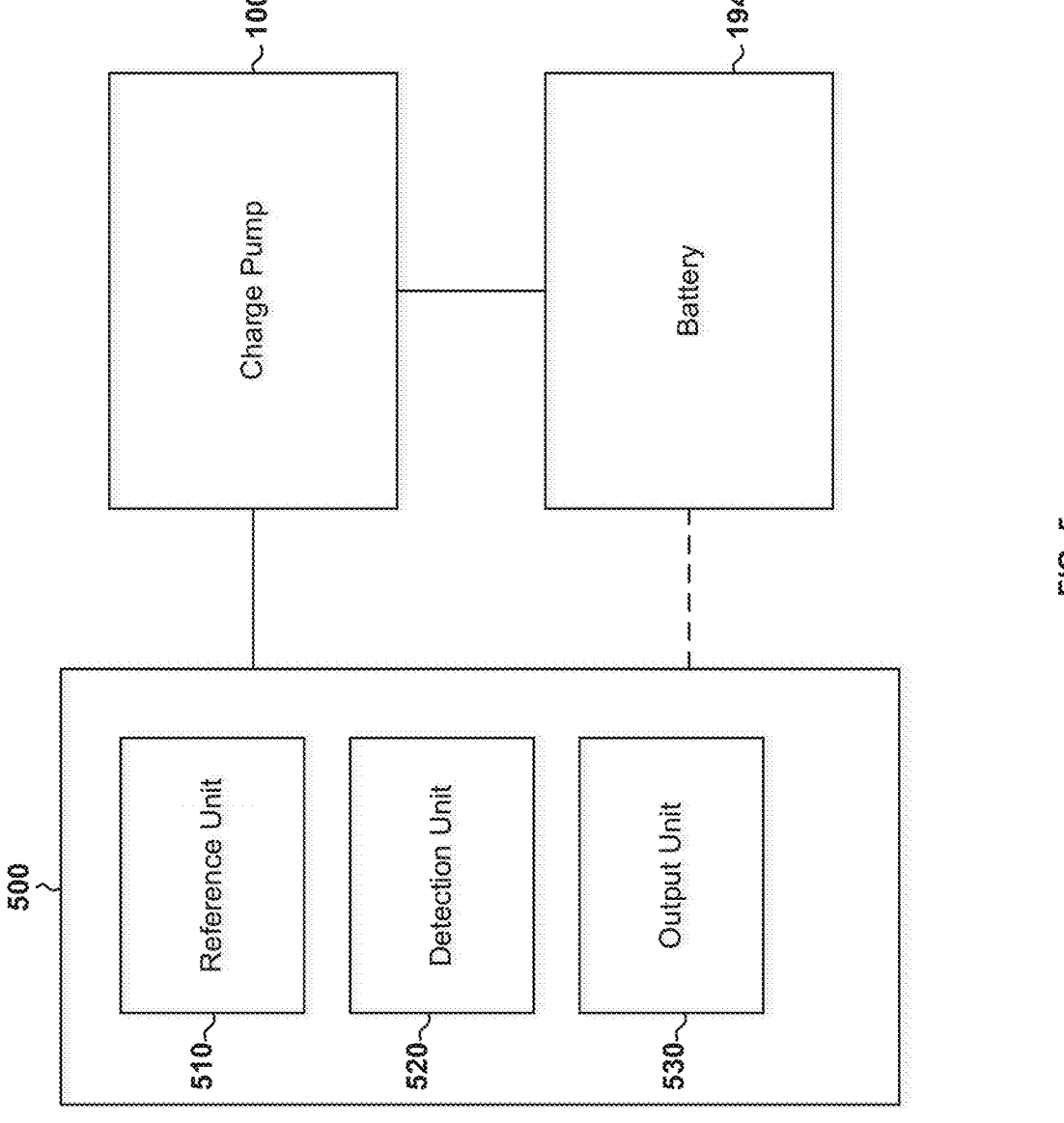
FIG. 5 is a simplified diagram showing an overcurrent detector for a charging path of the charge pump as shown in FIG. 1 according to certain embodiments of the present invention.

FIG. 5 is a simplified diagram showing an overcurrent detector for the charging path 112, the charging path 122, the charging path 152 and/or the charging path 162 of the charge pump 100 as shown in FIG. 1 according to certain embodiments of the present invention. This diagram is merely an example, which should not unduly limit the scope of the claims. One of ordinary skill in the art would recognize many variations, alternatives, and modifications. The over-current detector 500 includes a reference unit 510, a detection unit 520, and an output unit 530. For example, the reference unit 510 includes the current source 411 and the voltage divider subunits 412 and 413. As an example, the detection unit 520 includes the current source 421 and the voltage divider subunits 422 and 423. For example, the output unit 530 includes the current source 431, the switch 432, and the logic subunit 433. As an example, the reference unit 510 is coupled to the detection unit 520, and the detection unit 520 is coupled to the output unit 530. Although the above has been shown using a selected group of components for the overcurrent detector 500, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

In some embodiments, the reference unit 510 generates a reference voltage (e.g., the voltage 482). For example, the voltage 482 is the voltage 235. As an example, the voltage 482 is the voltage 351. In certain embodiments, the detection unit 520 generates a detection voltage (e.g., the voltage 484). For example, the voltage 484 is the voltage 233. As an example, the voltage 484 is the voltage 353.

According to some embodiments, the output unit 530 compares the reference voltage (e.g., the voltage 482) generated by the reference unit 510 and the detection voltage (e.g., the voltage 484) generated by the detection unit 520, and in response, generates an over-current-protection signal 443). In certain examples, if the detection voltage (e.g., the voltage 484)

generated by the detection unit 520 does not exceed the reference voltage (e.g., the voltage 482) generated by the reference unit 510, the over-current-protection signal (e.g., the over-current-protection signal 443) is at the logic low level, indicating the charging path (e.g., the charging path 112, the charging path 122, the charging path 152 and/or the charging path 162) of the charge pump 100 that is being detected by the overcurrent detector 500 does not carry an excess current. For example, if the over-current-protection signal (e.g., the over-current-protection signal 443) indicates that the charging path (e.g., the charging path 112, the charging path 122, the charging path 152 and/or the charging path 162) of the charge pump 100 that is being detected by the overcurrent detector 500 does not carry an excess current, the over-current-protection signal (e.g., the over-current-protection signal 443) is not used to disconnect the charging path (e.g., the charging path 112, the charging path 122, the charging path 152 and/or the charging path 162) of the charge pump 100 that is being detected by the overcurrent detector 500. In some examples, if the detection voltage (e.g., the voltage 484) generated by the detection unit 520 exceeds the reference voltage (e.g., the voltage 482) generated by the reference unit 510, the over-current-protection signal (e.g., the over-current-protection signal 443) is at the logic high level, indicating the charging path (e.g., the charging path 112, the charging path 122, the charging path 152 and/or the charging path 162) of the charge pump 100 that is being detected by the overcurrent detector 500 carries an excess current. For example, if the over-current-protection signal (e.g., the over-current-protection signal 443) indicates that the charging path (e.g., the charging path 112, the charging path 122, the charging path 152 and/or the charging path 162) of the charge pump 100 that is being detected by the overcurrent detector 500 carries an excess current, the over-current-protection signal (e.g., the over-current-protection signal 443) is used to disconnect the charging path (e.g., the charging path 112, the charging path 122, the charging path 152 and/or the charging path 162) of the charge pump 100 that is being detected by the overcurrent detector 500.

In certain embodiments, the overcurrent detector 500 includes the overcurrent detector 200 for the charging path 112 of the charge pump 100. For example, the reference unit 510 includes the current source 210, the transistor 220, the resistor 230 and the transistor 228. As an example, the detection unit 520 includes the current source 212, the transistor 222 and the resistor 232. For example, the output unit 530 includes the current source 214, the switch 224, the NOT gate 240 and the AND gate 242. In some examples, for each period of a clock signal, the overcurrent detector 200 performs overcurrent detection for the charging path 112 during the first charging duration and performs overcurrent detection for the charging path 152 during the second charging duration.

In some embodiments, the overcurrent detector 500 includes the overcurrent detector 300 for the charging path 122 of the charge pump 100. For example, the reference unit 510 includes the current source 310, the transistors 320 and 350, the resistor 330 and the transistor 328. As an example, the detection unit 520 includes the current source 312, the transistors 322 and 352, and the resistor 332. For example, the output unit 530 includes the current source 314, the switch 324, the NOT gate 340 and the AND gate 342. In some examples, for each period of a clock signal, the overcurrent detector 300 performs overcurrent detection for the charging path 162 during the first charging duration and performs overcurrent detection for the charging path 122 during the second charging duration.

As discussed above and further emphasized here, FIG. 5 is merely an example, which should not unduly limit the scope of the claims. One of ordinary skill in the art would recognize many variations, alternatives, and modifications. In certain embodiments, the overcurrent detector 500 includes the overcurrent detector 200 and the overcurrent detector 300. For example, during the first charging duration of each period of the clock signal, the overcurrent detector 500 uses the overcurrent detector 200 to perform overcurrent detection for the charging path 112 and uses the overcurrent detector 300 to perform overcurrent detection for the charging path 162. As an example, during the second charging duration of each period of the clock signal, the overcurrent detector 500 uses the overcurrent detector 200 to perform overcurrent detection for the charging path 152 and uses the overcurrent detector 300 to perform overcurrent detection for the charging path 122. In some embodiments, the overcurrent detector 500 also includes a current holding unit. For example, the current holding unit includes the transistor 226 (e.g., the PMOS 226) as shown in FIG. 2. As an example, the current holding unit includes the transistor 326 (e.g., the NMOS 326) as shown in FIG. 3.

Some embodiments of the present invention provide an overcurrent detector for a charge pump, wherein the overcurrent detector generates a reference voltage and a detection voltage for a charging path of the charge pump and quickly generates an over-current-protection signal based at least in part on a comparison between the reference voltage and the detection voltage. For example, the over-current-protection signal indicates whether the charging path carries an excess current. As an example, if the over-current-protection signal indicates that the charging path carries an excess current, the over-current-protection signal is used to disconnect the charging path of the charge pump in order to prevent damage to one o or more components of the charging path. Certain embodiments of the present invention provide an overcurrent detector for a charge pump, wherein the overcurrent detector needs only a detection time that less than ten nanoseconds in order to determine whether a charging path carries an excess current. For example, within such a detection time less than ten nanoseconds, the charging path can be disconnected before one or more components of the charge pump are damaged by the excess current.

According to certain embodiments, an overcurrent detector for a charging path of a charge pump, the charging path including a switch associated with a switch on-resistance value, the charge pump being configured to receive an input voltage and generate an output voltage to charge a battery, the overcurrent detector including: a reference unit biased to the output voltage and configured to generate a reference voltage representing a predetermined threshold current for the switch of the charging path; a detection unit coupled to the reference unit and configured to generate a sensing voltage representing a charging current that flows through the switch of the charging path; and an output unit configured to generate an over-current-protection signal based at least in part on the reference voltage and the sensing voltage; wherein the output unit is further configured to, in response to the sensing voltage exceeding the reference voltage, generate the over-current-protection signal that indicates the charging current exceeds the predetermined threshold current. For example, the overcurrent detector is implemented according to at least FIG. 2, FIG. 3, FIG. 4, and/or FIG. 5.

As an example, the output unit is further configured to, in response to the sensing voltage not exceeding the reference voltage, generate the over-current-protection signal that indicates the charging current does not exceed the predetermined threshold current. For example, in response to the over-current-protection signal indicating that the charging current exceeds the predetermined threshold current, the over-current-protection signal is used to open the switch and disconnect the charging path; and in response to the over-current-protection signal indicating that the charging current does not exceed the predetermined threshold current, the over-current-protection signal is not used to open the switch and is not used to disconnect the charging path.

As an example, the reference unit includes: a first current source configured to generate a first reference current; and a first transistor associated with a first on-resistance value. For example, the first reference current is equal to the predetermined threshold current divided by a predetermined constant; and the first on-resistance value is equal to the switch on-resistance value multiplied by the predetermined constant. As an example, the detection unit includes a second current source configured to generate a second reference current that is equal to the first reference current in magnitude. For example, the reference unit includes a second transistor associated with a second on-resistance value; and the detection unit includes a third transistor associated with a third on-resistance value; wherein: the second transistor and the third transistor are coupled to each other; and the second on-resistance value and the third on-resistance value are equal. As an example, the output unit includes a third current source configured to generate a third reference current that is equal to the first reference current in magnitude. For example, the output unit further includes: a fourth transistor connected to the third current source; a NOT gate connected to the third current source and the fourth transistor and configured to generate a first logic signal; and an AND gate configured to receive the first logic signal and a second logic signal and generate the over-current-protection signal. As an example, the first transistor of the reference unit is configured to receive a drive signal; and the drive signal and the second logic signal are the same. For example, the detection unit includes a fifth transistor connected to the third transistor and configured to receive a drive signal; and the drive signal and the second logic signal are the same.

As an example, the overcurrent detector is configured to periodically perform overcurrent detection for the charging path of the charge pump. For example, the overcurrent detector is further configured to: perform the overcurrent detection for the charging path of the charge pump during a first charging duration of each period of a periodic clock signal; and not perform the overcurrent detection for the charging path of the charge pump during a second charging duration of the each period of the periodic clock signal; wherein the each period of the periodic clock signal includes the first charging duration and the second charging duration. As an example, the overcurrent detector further includes a current holding unit configured to allow a reference current to flow from at least a part of the reference unit through the current holding unit during the second charging duration of the each period of the periodic clock signal. For example, the overcurrent detector is further configured to: not perform the overcurrent detection for the charging path of the charge pump during a first charging duration of each period of a periodic clock signal; and perform the overcurrent detection for the charging path of the charge pump during a second charging duration of the each period of the periodic clock signal; wherein the each period of the periodic clock signal includes the first charging duration and the second charging duration. As an example, the overcurrent detector further includes a current holding unit configured to allow a reference current to flow from at least a part of the detection unit through the current holding unit during the first charging duration of the each period of the periodic clock signal.

According to some embodiments, an overcurrent detection method for a charging path of a charge pump, the charging path including a switch associated with a switch on-resistance value, the charge pump being configured to receive an input voltage and generate an output voltage to charge a battery, the overcurrent detection method including: generating a reference voltage representing a predetermined threshold current for the switch of the charging path based at least in part on the output voltage; generating a sensing voltage representing a charging current that flows through the switch of the charging path; processing information associated with the reference voltage and the sensing voltage; and generating an over-current-protection signal based at least in part on the reference voltage and the sensing voltage; wherein the generating an over-current-protection signal based at least in part on the reference voltage and the sensing voltage includes: in response to the sensing voltage exceeding the reference voltage, generating the over-current-protection signal that indicates the charging current exceeds the predetermined threshold current. For example, the overcurrent detection method is implemented according to at least FIG. 2, FIG. 3, FIG. 4, and/or FIG. 5.

As an example, the generating an over-current-protection signal based at least in part on the reference voltage and the sensing voltage further includes: in response to the sensing voltage not exceeding the reference voltage, generating the over-current-protection signal that indicates the charging current does not exceed the predetermined threshold current. For example, the overcurrent detection method further includes: in response to the over-current-protection signal indicating that the charging current exceeds the predetermined threshold current, using the over-current-protection signal to open the switch and disconnect the charging path; and in response to the over-current-protection signal indicating that the charging current does not exceed the predetermined threshold current, not using the over-current-protection signal to open the switch and not using the over-current-protection signal to disconnect the charging path. As an example, the overcurrent detection method further includes: performing overcurrent detection for the charging path of the charge pump during each period of a periodic clock signal; wherein the each period of the periodic clock signal includes the first charging duration and the second charging duration. For example, the performing overcurrent detection for the charging path of the charge pump during each period of a periodic clock signal includes: performing the overcurrent detection for the charging path of the charge pump during the first charging duration of the each period of the periodic clock signal; and not performing the overcurrent detection for the charging path of the charge pump during the second charging duration of the each period of the periodic clock signal. As an example, the performing overcurrent detection for the charging path of the charge pump during each period of a periodic clock signal includes: not performing the overcurrent detection for the charging path of the charge pump during the first charging duration of the each period of the periodic clock signal; and performing the overcurrent detection for the charging path of the charge pump during the second charging duration of the each period of the periodic clock signal.

For example, some or all components of various embodiments of the present invention each are, individually and/or in combination with at least another component, imple-mented using one or more software components, one or more hardware components, and/or one or more combinations of software and hardware components. As an example, some or all components of various embodiments of the present invention each are, individually and/or in combination with at least another component, implemented in one or more circuits, such as one or more analog circuits and/or one or more digital circuits. For example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments.

What is claimed is:

1. An overcurrent detector for a charging path of a charge pump, the charging path including a switch associated with a switch on-resistance value, the charge pump being configured to receive an input voltage and generate an output voltage to charge a battery, the overcurrent detector comprising:

a reference unit biased to the output voltage and configured to generate a reference voltage representing a predetermined threshold current for the switch of the charging path;

a detection unit coupled to the reference unit and configured to generate a sensing voltage representing a charging current that flows through the switch of the charging path; and an output unit configured to generate an over-current-protection signal based at least in part on the reference voltage and the sensing voltage;

wherein the output unit is further configured to, in response to the sensing voltage exceeding the reference voltage, generate the over-current-protection signal that indicates the charging current exceeds the predetermined threshold current;

wherein the reference unit includes:

a first current source configured to generate a first reference current; and a first transistor associated with a first on-resistance value.

2. The overcurrent detector of claim 1 wherein:

the first reference current is equal to the predetermined threshold current divided by a predetermined constant; and the first on-resistance value is equal to the switch on-resistance value multiplied by the predetermined constant.

3. The overcurrent detector of claim 1 wherein the detection unit includes a second current source configured to generate a second reference current that is equal to the first reference current in magnitude.

4. The overcurrent detector of claim 3 wherein:

the reference unit includes a second transistor associated with a second on-resistance value; and the detection unit includes a third transistor associated with a third on-resistance value;

wherein:

the second transistor and the third transistor are coupled to each other; and the second on-resistance value and the third on-resistance value are equal.

5. The overcurrent detector of claim 4 wherein the output unit includes a third current source configured to generate a third reference current that is equal to the first reference current in magnitude.

6. The overcurrent detector of claim 5 wherein the output unit further includes:

a fourth transistor connected to the third current source;

a NOT gate connected to the third current source and the fourth transistor and configured to generate a first logic signal; and an AND gate configured to receive the first logic signal and a second logic signal and generate the over-current-protection signal.

7. The overcurrent detector of claim 6 wherein:

the first transistor of the reference unit is configured to receive a drive signal; and the drive signal and the second logic signal are the same.

8. The overcurrent detector of claim 6 wherein:

the detection unit includes a fifth transistor connected to the third transistor and configured to receive a drive signal; and the drive signal and the second logic signal are the same.

9. An overcurrent detector for a charging path of a charge pump, the charging path including a switch associated with a switch on-resistance value, the charge pump being configured to receive an input voltage and generate an output voltage to charge a battery, the overcurrent detector comprising:

a reference unit biased to the output voltage and configured to generate a reference voltage representing a predetermined threshold current for the switch of the charging path;

a detection unit coupled to the reference unit and configured to generate a sensing voltage representing a charging current that flows through the switch of the charging path; and an output unit configured to generate an over-current-protection signal based at least in part on the reference voltage and the sensing voltage;

wherein the output unit is further configured to, in response to the sensing voltage exceeding the reference voltage, generate the over-current-protection signal that indicates the charging current exceeds the predetermined threshold current;

wherein the overcurrent detector is configured to periodically perform overcurrent detection for the charging path of the charge pump;

wherein the overcurrent detector is further configured to:

perform the overcurrent detection for the charging path of the charge pump during a first charging duration of each period of a periodic clock signal; and not perform the overcurrent detection for the charging path of the charge pump during a second charging duration of the each period of the periodic clock signal;

wherein the each period of the periodic clock signal includes the first charging duration and the second charging duration.

10. The overcurrent detector of claim 9, and further comprising a current holding unit configured to allow a reference current to flow from at least a part of the reference unit through the current holding unit during the second charging duration of the each period of the periodic clock signal.

11. An overcurrent detector for a charging path of a charge pump, the charging path including a switch associated with a switch on-resistance value, the charge pump being configured to receive an input voltage and generate an output voltage to charge a battery, the overcurrent detector comprising:

a reference unit biased to the output voltage and configured to generate a reference voltage representing a predetermined threshold current for the switch of the charging path;

a detection unit coupled to the reference unit and configured to generate a sensing voltage representing a charging current that flows through the switch of the charging path; and an output unit configured to generate an over-current-protection signal based at least in part on the reference voltage and the sensing voltage;

wherein the output unit is further configured to, in response to the sensing voltage exceeding the reference voltage, generate the over-current-protection signal that indicates the charging current exceeds the predetermined threshold current;

wherein the overcurrent detector is configured to periodically perform overcurrent detection for the charging path of the charge pump;

wherein the overcurrent detector is further configured to:

not perform the overcurrent detection for the charging path of the charge pump during a first charging duration of each period of a periodic clock signal; and perform the overcurrent detection for the charging path of the charge pump during a second charging duration of the each period of the periodic clock signal;

wherein the each period of the periodic clock signal includes the first charging duration and the second charging duration.

12. The overcurrent detector of claim 11, and further comprising a current holding unit configured to allow a reference current to flow from at least a part of the detection unit through the current holding unit during the first charging duration of the each period of the periodic clock signal.

13. An overcurrent detection method for a charging path of a charge pump, the charging path including a switch associated with a switch on-resistance value, the charge pump being configured to receive an input voltage and generate an output voltage to charge a battery, the overcurrent detection method comprising:

generating a reference voltage representing a predetermined threshold current for the switch of the charging path based at least in part on the output voltage;

generating a sensing voltage representing a charging current that flows through the switch of the charging path;

processing information associated with the reference voltage and the sensing voltage;

generating an over-current-protection signal based at least in part on the reference voltage and the sensing voltage; and performing overcurrent detection for the charging path of the charge pump during each period of a periodic clock signal;

wherein the generating an over-current-protection signal based at least in part on the reference voltage and the sensing voltage includes:

in response to the sensing voltage exceeding the reference voltage, generating the over-current-protection signal that indicates the charging current exceeds the predetermined threshold current;

wherein the each period of the periodic clock signal includes the first charging duration and the second charging duration.

14. The overcurrent detection method of claim 13 wherein the performing overcurrent detection for the charging path of the charge pump during each period of a periodic clock signal includes:

performing the overcurrent detection for the charging path of the charge pump during the first charging duration of the each period of the periodic clock signal; and not performing the overcurrent detection for the charging path of the charge pump during the second charging duration of the each period of the periodic clock signal.

15. The overcurrent detection method of claim 13 wherein the performing overcurrent detection for the charging path of the charge pump during each period of a periodic clock signal includes:

not performing the overcurrent detection for the charging path of the charge pump during the first charging duration of the each period of the periodic clock signal; and performing the overcurrent detection for the charging path of the charge pump during the second charging duration of the each period of the periodic clock signal.

* * * * *